(12) United States Patent
Dubois et al.

(10) Patent No.: US 11,715,589 B2
(45) Date of Patent: Aug. 1, 2023

(54) INDUCTIVE FILTERING DEVICE AND ELECTRICAL ARCHITECTURE IMPLEMENTING THE INDUCTIVE FILTERING DEVICE

(71) Applicant: THALES, Courbevoie (FR)

(72) Inventors: Eric Ravindranath Dubois, Chatou (FR); Hocine Kherbouchi, Chatou (FR); Frédéric Lacaux, Chatou (FR); Damian Andrade, Chatou (FR); Stéphane Guguen, Chatou (FR)

(73) Assignee: THALES, Courbevoie (FR)

( * ) Notice: Subject to any disclaimer, the term of this patent is extended or adjusted under 35 U.S.C. 154(b) by 445 days.

(21) Appl. No.: 16/863,851

(22) Filed: Apr. 30, 2020

(65) Prior Publication Data
US 2020/0350109 A1 Nov. 5, 2020

(30) Foreign Application Priority Data
May 2, 2019 (FR) ...................................... 1904575

(51) Int. Cl.
| H01F 27/24 | (2006.01) |
| H01F 27/28 | (2006.01) |
| H03H 7/01 | (2006.01) |
| H02M 5/458 | (2006.01) |
| H03H 7/42 | (2006.01) |
| H03H 1/00 | (2006.01) |

(52) U.S. Cl.
CPC ............. *H01F 27/24* (2013.01); *H01F 27/28* (2013.01); *H02M 5/458* (2013.01); *H03H 7/01* (2013.01); *H03H 7/427* (2013.01); *H03H 1/0007* (2013.01)

(58) Field of Classification Search
CPC ...... H03H 7/427; H03H 1/0007; H01F 27/24; H01F 27/28
USPC .................................................. 333/177, 181
See application file for complete search history.

(56) References Cited

U.S. PATENT DOCUMENTS

| 4,160,966 A | 7/1979 | Kennedy |
| 2006/0125586 A1 | 6/2006 | Lee et al. |
| 2008/0037298 A1 | 2/2008 | Lafontaine |
| 2018/0261381 A1* | 9/2018 | Igarashi ................. H01F 27/32 |

FOREIGN PATENT DOCUMENTS

| EP | 2 887 519 A2 | 6/2015 |
| JP | 7-153613 A | 6/1995 |
| WO | 2007/113312 A1 | 10/2007 |

* cited by examiner

*Primary Examiner* — Rakesh B Patel
(74) *Attorney, Agent, or Firm* — BakerHostetler

(57) ABSTRACT

An inductive filtering device includes a plurality of grouped electrical conductors and at least two toric magnetic cores, each formed around a central void, the two magnetic cores having different magnetic lengths, the electrical conductor being wound together around both magnetic cores by passing through the central voids of both magnetic cores.

20 Claims, 7 Drawing Sheets

INDUCTIVE FILTERING DEVICE AND ELECTRICAL ARCHITECTURE IMPLEMENTING THE INDUCTIVE FILTERING DEVICE

CROSS-REFERENCE TO RELATED APPLICATIONS

This application claims priority to foreign French patent application No. FR 1904575, filed on May 2, 2019, the disclosure of which is incorporated by reference in its entirety.

FIELD OF THE INVENTION

The invention relates to an inductive filtering device. This type of filtering is commonly used to decrease potential interference present on an electrical conductor. The device is then positioned in series on the conductor.

The invention also relates to an electrical architecture implementing the inductive filtering device. The invention is highly suitable for an electrical network on board a vehicle. The invention is particularly useful in the field of aeronautics, in which the current trend is to increase the amount of electrical equipment and thus the on-board electrical power.

BACKGROUND

An aeroplane generally comprises a large number of electrical loads that are supplied with electrical power by an on-board electrical supply network. For example, the aeroplane flight controls, the air-conditioning systems and the internal lighting employ three-phase AC electric machines. The electrical energy supplied to these machines comes from power converters connected to an on-board network which provides electrical energy in the form of direct or alternating current. The on-board network may for example comprise electric generators, storage batteries, or even means for connecting to an electrical supply network which is external to the aeroplane and which allows electricity to be supplied to the aeroplane when it is parked at an airport. Aeroplanes often contain 540 V DC networks and/or 115 V or 230 V, 400 Hz AC networks. As is known, power converters receive energy from the on-board network to convert it into polyphase AC energy that matches the power and frequency requirements of the load. When a converter is supplied with power by an AC network, the converter comprises, for example, a rectifier that delivers a DC voltage, followed by an inverter that produces the AC voltage required for the load on the basis of the DC voltage. When a converter is supplied with power by a DC network, the converter then comprises a circuit that performs the function of inverter and produces the AC voltage directly on the basis of the DC voltage of the on-board network. A converter may be dedicated to a load or common to a plurality of loads.

In many vehicles and more particularly for aeroplanes, decreasing the on-board weight is an ongoing problem. For example, an attempt has been made to pool converters. This pooling is, for example, described in patent application WO2007/113312 filed by the applicant. In this document, one and the same converter may be used to supply power to different loads. A routing system allows one or more converters to be assigned to one load or another according to the instantaneous power needs of the various loads.

Combining a plurality of converters in parallel is envisaged, making it possible to supply the required level of power to a load. Connecting converters in parallel by real-time allocation to the plurality of loads, controlled by a control member, makes it possible to optimize on-board power conversion and therefore to limit the weight and cost of the conversion elements.

Implementing a modular and reconfigurable electrical power supply device is therefore dependent on the ability to parallelize and to interlink a plurality of converters dynamically. However, parallelizing and/or interlinking runs into difficulties related in particular to generating recirculation currents between the converters. These recirculation currents significantly increase the total current seen by the active components of the converters. To overcome the difficulties presented by the generation of recirculation currents, one envisaged solution consists in implementing coupling inductors, also called interphase inductors, between converters that are combined in parallel. This type of component comes with substantial weight and volume in order to withstand large recirculation currents without saturation. In addition, this type of component fixes the number of converters that are connected in parallel. It is then difficult to vary in real time the number of converters that it is desired to connect in parallel.

Patent application EP 2 887 519, also filed by the applicant, proposes replacing these components common to a plurality of converters with common-mode filters distributed in each of the converters. More specifically, at the input or output of each inverter, common-mode inductors are arranged on the phases of each inverter, the inductors of each inverter being independent. These inductors make it possible both to interlink a plurality of inverters and to decrease common-mode interference. This solution with distributed components allows a possible variation in the number of converters combined in parallel to be regained. It is critical to prevent inductor saturation, which means magnetic cores of large cross section and consequently inductors of substantial weight.

Another requirement should also be taken into account in an electrical architecture. It should be robust with respect to electromagnetic interference to which it could be subjected from the outside. The architecture should also limit its interference emissions. This requirement is generally called "electromagnetic compatibility" and is generally dealt with by means of passive filters.

The characteristics of the filters used to meet the electromagnetic compatibility requirement are far removed from those of the common-mode filters that patent application EP 2 887 519 proposes using to limit recirculation currents when a plurality of inverters are connected in parallel. In an electrical architecture with converters connected in parallel, it is therefore necessary to provide two distinct types of filter, one to comply with the electromagnetic compatibility requirement and the other to limit recirculation currents between converters.

SUMMARY OF THE INVENTION

The invention proposes a novel type of filter that makes it possible both to decrease recirculation currents and to meet the electromagnetic compatibility requirement. The filtering device according to the invention is for example able to be used as a common-mode filter incorporated in a converter.

To this end, one subject of the invention is an inductive filtering device comprising a plurality of grouped electrical conductors, each intended to carry a different voltage, and at least two toric magnetic cores, each formed around a central void, the two magnetic cores having different magnetic lengths, the electrical conductors being wound together around both magnetic cores by passing through the central voids of both magnetic cores, wherein the toric magnetic cores are formed in different materials, the material of the magnetic core having the shortest magnetic length exhibiting a maximum relative magnetic permeability lower than or equal to 3000 and lower than that of the material of the magnetic core having the longest magnetic length.

For many manufacturers, a magnetic permeability of "low" value is measured for a magnetic excitation of 100 mA/cm at a frequency of 10 kHz. The value of 3000 is considered to be "low". For measurements taken under these conditions, a tolerance of +/−15% is acceptable. More specifically, when a manufacturer gives a nominal value of 3000, the actual value of the relative magnetic permeability may vary from 2550 to 3450. All given magnetic circuits for a nominal value of 3000 and having an actual value of 3450 are considered to meet the stated condition.

Advantageously, the electrical conductors together form at least one turn wound around both magnetic cores and at least one other turn wound around the magnetic core having the shortest magnetic length without being wound around the other of the two magnetic cores.

Advantageously, each of the central voids runs along an axis, the axes being coincident.

Each of the central voids has an empty cross section perpendicular to the respective axis thereof. In a first variant of the invention, the cross sections of the different central voids are advantageously identical.

In a second variant of the invention, one of the two magnetic cores is arranged inside the central void of the other magnetic core.

The two magnetic cores may form a one-piece assembly.

In a third variant of the invention, the filtering device comprises a plurality of series of toric magnetic cores inserted into one another, the magnetic cores of a first of the series being nested around a first axis, the magnetic cores of a second of the series being nested around a second axis, the first axis being distinct from the second axis. The electrical conductor forms a first winding around the first of the series and forms a second winding around the second of the series.

In a fourth variant of the invention, the electrical conductor forms a complementary winding wound around the magnetic cores without passing through the central void thereof.

The magnetic cores may exhibit regular or irregular tubular shapes.

Advantageously, the magnetic core having the shortest magnetic length comprises at least one groove configured to increase the reluctance of the magnetic core in question over the entire height of the central void, which height is defined along an axis around which the central void is formed.

The groove may be configured to vary the reluctance of the magnetic core in question along an abscissa of the axis around which the central void is formed.

The groove may be configured to lower the reluctance of the magnetic core in question with distance away from the axis around which the central void is formed.

Another subject of the invention is an electrical architecture comprising a plurality of converters suitable for supplying a load with power in parallel, each of the converters comprising at least one inductive filtering device according to one of the preceding claims.

Advantageously, the converters receive energy in the form of direct current and deliver energy in the form of polyphase alternating currents, wherein each converter comprises, at input, an inductive filtering device according to the invention in which the direct current flows through the conductors wound together, wherein each converter comprises, at output, an inductive filtering device according to the invention in which the alternating currents flow through the conductors wound together.

BRIEF DESCRIPTION OF THE DRAWINGS

The invention will be better understood and further advantages will become apparent upon reading the detailed description of one embodiment provided by way of example, which description is illustrated by the attached drawing, in which.

For the sake of clarity, the same elements will bear the same references in the various figures.

DETAILED DESCRIPTION

Figure 1A:
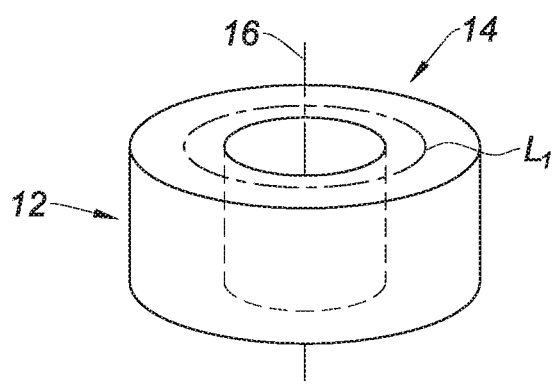
FIGS. 1a and 1b show two magnetic cores of different sizes.

FIG. 1a shows a toric magnetic core 12 formed around a central void 14. The magnetic core is tubular in shape and extends around an axis 16. The central void is formed around the axis 16. Geometrically speaking, the magnetic core 12 may be characterized by its magnetic length $L_1$. Generally speaking, the magnetic length is the mean length of the magnetic field lines that flow through the magnetic core. When a coil is wound around a toric magnetic core by passing through the central void, and when the magnetic core is made in a homogeneous material, the magnetic length is substantially the length of the mean fibers surrounding the central void. More precisely, the length of the mean fibers is the length of an axis formed by the center of the sections of the magnetic core in planes containing the axis 16 around which the central void 14 is formed. In the example shown in FIG. 1a, the central void 14 has a circular cross section perpendicular to the axis 16 and the magnetic length $L_1$ is the perimeter of a circle. Generally speaking, the magnetic length L is used to apply Ampère's law on a macroscopic scale:

$$HL = n.i \qquad (1)$$

H represents the magnetic excitation before saturation and i represents the current flowing through n turns wound around the magnetic core.

Figure 1B:
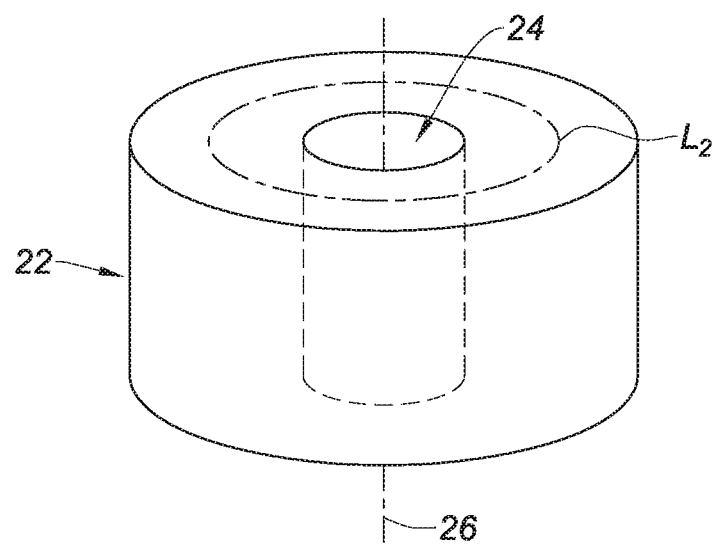

FIG. 1b shows a second toric magnetic core 22 formed around a central void 24. The second magnetic core 22 is tubular in shape and extends around an axis 26. The central void 24 extends along the axis 26. The magnetic length $L_2$ of the second toric magnetic core 22 is greater than the magnetic length $L_1$ of the first magnetic core 12.

The two magnetic cores 12 and 22 are closed magnetic cores, without an air gap. This type of core is typically referred to as "toric" by many manufacturers. This qualifier covers more than just the shape of a torus as defined mathematically. In particular, there are magnetic cores referred to as toric with cross sections that are circular, rectangular, etc.

Figure 2:
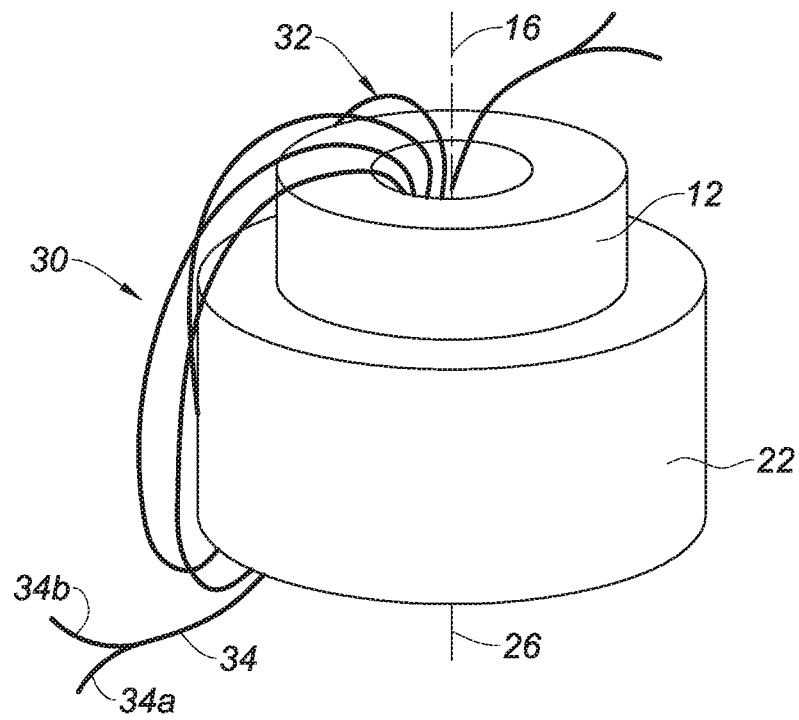
FIG. 2 shows a first variant inductive filtering device according to the invention implementing the magnetic cores shown in FIGS. 1a and 1b.

FIG. 2 shows a first variant filtering device 30 comprising the two toric magnetic cores 12 and 22. In the example shown, the two cores 12 and 22 have different external diameters. The external diameter of the first magnetic core 12 around the axis 16 is greater than the diameter of the central void 24 around the axis 26. The two cores 12 and 22 are distinct and superposed such that the axes 16 and 26 are coincident. A winding 32 of a plurality of turns of a group of electrical conductors 34 is formed around the stack of the two magnetic cores 12 and 22 by passing through the two central voids 14 and 24. Thus, each of the two magnetic cores 12 and 22 receives magnetic excitation generated by the currents flowing through the group of electrical conductors 34. In the example shown in FIG. 2, the group 34 comprises two electrical conductors 34a and 34b wound together around the two magnetic cores 12 and 22. The two electrical conductors 34a and 34b may be grouped together within a cable or remain separate. The two conductors 34a and 34b are electrically insulated from one another. Each turn of the winding is formed by simultaneously winding the two electrical conductors 34a and 34b. Conventionally, when two insulated electrical conductors are wound around a magnetic core, the two conductors 34a and 34b each form separate windings. Here, conversely, one of the conductors is immediately neighboured by the other conductor through each turn and all the way along the winding.

The two conductors 34a and 34b are intended to carry different voltages, for example the positive voltage and the negative voltage of the output of a DC power supply or the phase and the neutral of a single-phase AC power supply. It is also possible to envisage more than two grouped electrical conductors, for example to filter the different output phases of a polyphase AC power supply.

The electrical conductors each generate magnetic excitation in the magnetic cores 12 and 22. By winding the conductors separately, each in one distinct winding, even with an opposing current of the same value in each of the conductors, differential excitation may be generated in the magnetic cores 12 and 22 due to the difference in geometry of the different windings. The difference in excitation may be about 1 to 2%. Conversely, by winding the electrical conductors together in the same winding, the difference in excitation may stay below 0.1%. Winding the electrical conductors together allows the common-mode currents which may flow through the different conductors to be filtered more effectively without being disrupted by differential currents, risking the saturation of the magnetic cores.

The diameters of the central voids 14 and 24 are advantageously identical. The central voids 14 and 24 are arranged in the continuation of one another in order to facilitate the winding of the turns, in particular when the turns pass through the central voids 14 and 24. In FIG. 2, four turns are shown. It is well understood that in practice, it is possible to wind a greater number of turns, potentially exceeding thousands of turns. Additionally, it is possible to wind a plurality of independent electrical conductors around the magnetic cores 12 and 22. This is useful in particular when the filtering device is used in a polyphase network, each phase going through one of the conductors. In this first variant, it is possible to stack more than two magnetic cores.

Figure 3:
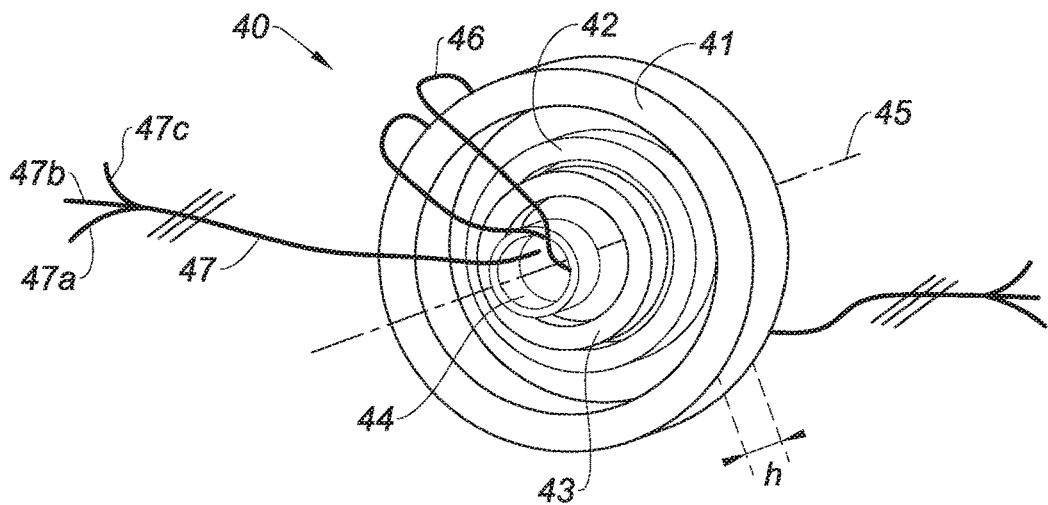
FIG. 3 shows a second variant inductive filtering device according to the invention implementing a plurality of toric magnetic cores inserted into one another.

FIG. 3 shows a second variant filtering device 40 in which a plurality of distinct toric magnetic cores are inserted into one another. More specifically, with two magnetic cores, the diameter of the central void of the first magnetic core is greater than the external diameter of the second magnetic core. Thus, the second magnetic core may be inserted into the central void of the first magnetic core. It is possible to implement the invention regardless of the number of magnetic cores inserted into one another. In the variant shown in FIG. 3, four toric magnetic cores 41, 42, 43 and 44 are inserted into one another. More specifically, the centremost core 44 is inserted into the central void of the core 43, which is itself inserted into the central void of the core 42, which is in turn inserted into the central void of the core 41. The magnetic lengths of the different cores are all different. The longest magnetic length is that of the core 41 and the shortest is that of the core 44.

In order to optimize the volume occupied by the filtering device 40, the axes of the central voids of the different magnetic cores 41 to 44 are advantageously coincident. In FIG. 3, these coincident axes bear the reference 45. This allows the central void of the magnetic core 41 to be occupied to the maximum. More specifically, to within a functional clearance, the diameter of the central void of the magnetic core 41 is equal to the external diameter of the magnetic core 42 and so on down to the magnetic core 44, the external diameter of which is equal to the diameter of the central void of the magnetic core 43. The diameters of the magnetic cores are defined around the axis 45 thereof.

Still with a view to optimizing the volume occupied by the filtering device 40, the heights h of the different magnetic cores as defined along the axis 45 thereof are advantageously all equal.

A winding 46 of a plurality of turns of a group of electrical conductors 47 is formed around the four magnetic cores 41 to 44 by passing through the central void of the magnetic core 44. In the example shown, three electrical conductors 47a, 47b and 47c form the group 47. The three conductors are wound together around the four magnetic cores 41 to 44. Thus, each of the four magnetic cores 41 to 44 receives magnetic excitation generated by the current flowing through the group of electrical conductors 47.

For each of the filtering devices 30 and 40 described with the aid of FIGS. 2 and 3, the cores which make it up all receive the same magnetomotive force corresponding to the current flowing through the winding multiplied by the number of turns of the winding (n.i). The magnetic excitation H differs from one core to the next according to the magnetic length of the core in question. More specifically, the magnetic excitation increases with decreasing core diameter. For example, in the filtering device 40, the magnetic excitation of the core 44 is greater than that of the core 43 and so on down to the lowest level of magnetic excitation, that of the core 41.

In an inductive filtering device, the different magnetic cores may be made in the same material. Thus, for the same frequency, when the current flowing through the winding increases, the core having the shortest magnetic length will reach its saturation excitation more quickly. Alternatively, the different magnetic cores may be made in different materials, in particular materials having different magnetic permeabilities. Like above, it is possible, for a given current, to saturate one of the magnetic cores while remaining below saturation of another magnetic core. For as long as the current flowing through the winding does not allow saturation to be reached for any of the magnetic circuits, the inductance value of the filter retains a high nominal value. When the current allows one of the cores to be saturated, the inductance value of the filter is lower than the nominal value but may retain a useful value allowing the filter to perform its function or at least some of its functions.

Alternatively, it is possible to choose the magnetic permeabilities and dimensions of the nested cores so as to obtain, for the same current flowing through the winding, saturation for all of the magnetic cores. To obtain this same saturation excitation, in addition to choosing the magnetic permeability of the different cores, it is also possible to adjust the dimensions of the different magnetic cores in order to modify the magnetic length of the different magnetic cores. In practice, for the magnetic core having the shortest magnetic length, for example the magnetic core 12 in the case of the filter 30 of FIG. 2, it is possible to choose a relative magnetic permeability $\mu_r$ that is lower than that of the magnetic core having the longest magnetic length, in this instance the magnetic core 22 of the filter 30.

In a first approach, a filter having a plurality of magnetic cores of different permeabilities may be equivalent to a filter having only one magnetic core exhibiting an equivalent permeability, the value of which lies between the extremal values of the different magnetic cores of the filter. This equivalence may be allowed when the different magnetic cores reach saturation for the same current, but also for different currents and, more specifically, for as long as the current flowing through the winding remains smaller than the smallest of the currents for which one of the magnetic cores reaches saturation.

In practice, the magnetic permeability of a core is dependent on the material used to make it. Core manufacturers offer, in their catalogues, various discrete magnetic permeability values. However, intermediate values are not directly available except by special order. By implementing the invention, it is possible to reach these intermediate values using standard components already provided by manufacturers.

Additionally, when using this type of filtering device in which the magnetic permeabilities of the different cores are different, the behaviour of the filter according to the frequency of the current which flows through the winding may differ from the behaviour of a filter with a single core made in a material exhibiting equivalent permeability.

Figure 4:
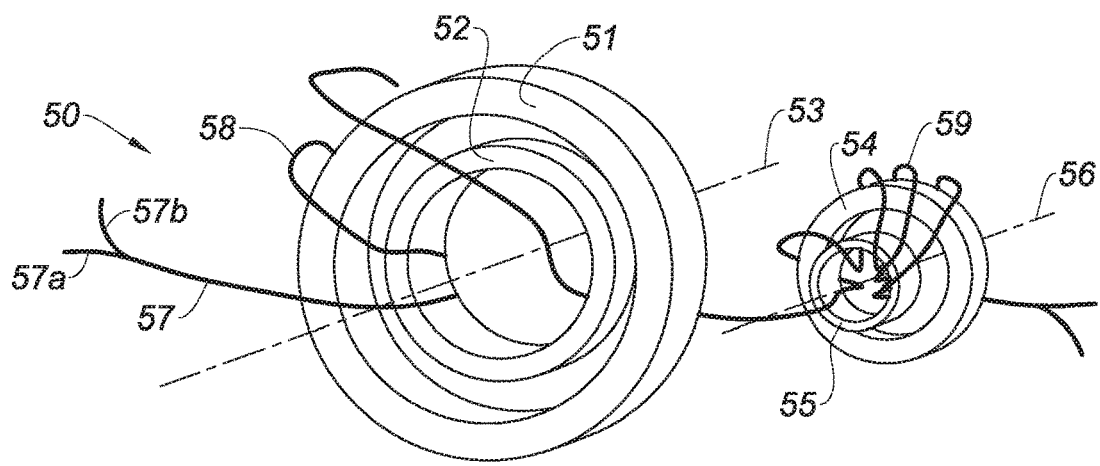
FIG. 4 shows a third variant inductive filtering device according to the invention implementing a plurality of series of toric magnetic cores inserted into one another.

By choosing, for the magnetic core having the shortest magnetic length, core 12 for FIG. 2 or core 44 for FIG. 3, a relative magnetic permeability value lower than 3000, this core will reach saturation only for very large currents. This makes it possible to filter large recirculation currents between a plurality of converters. The magnetic permeability, often denoted by $\mu_r$, of the materials used in the magnetic cores is given relative to the permeability of vacuum, often denoted by $\mu_0$. In theory, the relative magnetic permeability of a material is dependent on the current flowing through the winding arranged around the core and drops when the core is saturated. Magnetic material manufacturers state the maximum relative magnetic permeability, i.e. far from the saturation in the linear domain linking magnetic field and magnetic excitation field. It is this value which is retained to define the magnetic permeability of the magnetic cores. FIG. 4 shows a third variant filtering device 50 according to the invention implementing a plurality of series of toric magnetic cores inserted into one another. The filtering device 50, shown in FIG. 4, comprises a first series formed of two magnetic cores 51 and 52 nested one inside the other around an axis 53 and a second series formed of two magnetic cores 54 and 55 which are also nested one inside the other but around a second axis 56, distinct from the axis 53. This variant may be implemented regardless of the number of series and regardless of the number of magnetic cores per series. In practice, to produce a filtering device according to this variant, there is substantial freedom in the relative positioning of the axes 53 and 56, which may even be arranged in the continuation of one another.

A group of electrical conductors 57 comprises, in the example shown, two electrical conductors 57a and 57b. The group 57 forms a first winding 58 of n1 turns around the magnetic cores 51 and 52 by passing through the central void of the magnetic core 52 and forms a second winding 59 of n2 turns around the magnetic cores 54 and 55 by passing through the central void of the magnetic core 55. The electrical conductors 57a and 57b are wound together to form the n1 and n2 turns. One advantage of this variant is to make it possible to produce a filtering device in which the numbers of turns n1 and n2 are different. This makes it possible to apply different magnetomotive forces (n.i) to each series of magnetic cores. This variant is particularly advantageous in allowing a greater number of turns around the magnetic core having the lowest magnetic permeability. In other words, this allows the inductance of the filtering device to be increased by increasing the number of turns without negatively affecting the saturation of the one or more magnetic cores of high magnetic permeability.

Figure 5:
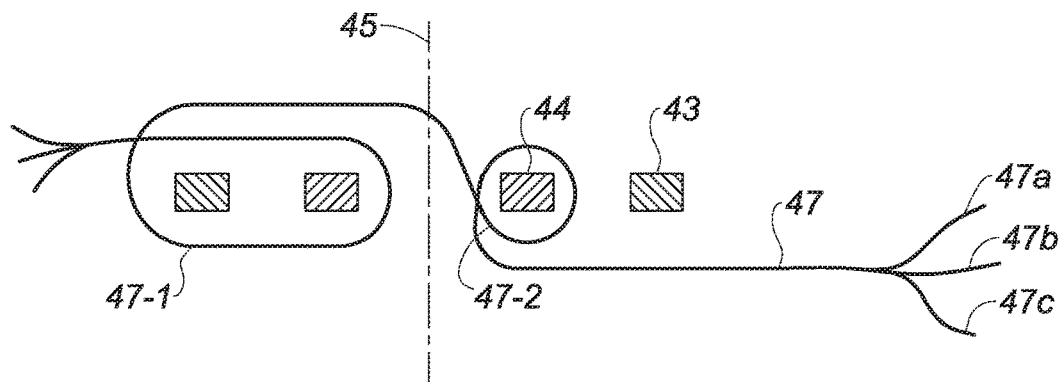
FIG. 5 shows a fourth variant inductive filtering device according to the invention implementing a plurality of toric magnetic cores inserted into one another.

FIG. 5 shows an example of a fourth variant inductive filtering device in which the magnetic cores 43 and 44 are inserted into one another like in FIG. 3. The magnetic core 44 is the smallest and its magnetic permeability is lower than that of the magnetic core 45. The electrical conductors of the group 47 together form a first turn 47-1 wound around the two magnetic cores 43 and 44 and a second turn 47-2 wound around the magnetic core 44 only. In other words, two turns surround the magnetic core 44 and a single turn surrounds the magnetic core 43. The two turns 47-1 and 47-2 are wound in the same direction. It is well known that the number of turns surrounding each of the magnetic cores 43 and 44 may be adjusted as needed. Additionally, it is possible to add other magnetic cores for example as shown in FIG. 3. The advantage of the variant shown in FIG. 5 is that it combines the advantage of compactness of the variant of FIG. 3 and that of adjusting the number of turns to the magnetic permeability of the different magnetic cores present as illustrated with the aid of FIG. 4.

More generally, the electrical conductors together form at least one turn wound around the magnetic core 44 having the shortest magnetic length $L_1$ and at least one other turn wound around a plurality of different magnetic cores belonging to the inductive filter.

Figure 6:
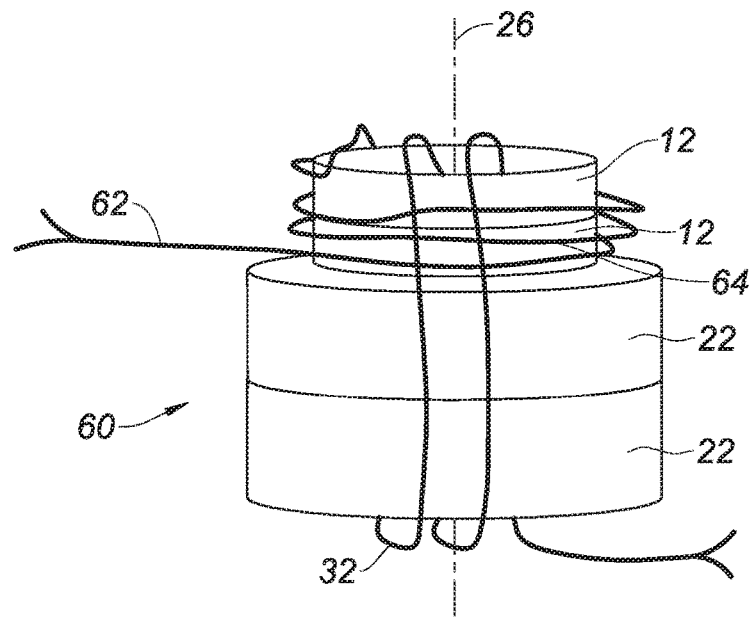
FIGS. 6 and 7 show two examples of a fifth variant inductive filtering device according to the invention implementing a plurality of superposed magnetic cores.

FIG. 6 shows one example of a fifth variant inductive filtering device 60 according to the invention implementing a plurality of magnetic cores of different external diameters and superposed onto one another like in the variant of FIG. 2. So as not to make the description cumbersome, the references 12 and 22 employed above will be reused. The filtering device 60 comprises a stack of two magnetic cores 22 and two magnetic cores 12 stacked on top of one another along the axis 26. This variant may be implemented regardless of the number of magnetic cores stacked on top of one another.

A group of electrical conductors 62 forms the winding 32 passing through the central voids of the magnetic cores 12 and 22 and a complementary winding 64 formed around the magnetic cores 12 without passing through the central void thereof. As above, the different electrical conductors of the group 62 are wound together to form the windings 32 and 64.

The complementary winding 64 makes it possible to obtain, for the magnetic cores 12, a magnetomotive force that is stronger than that received by the magnetic cores 22. To decrease the volume occupied by the filtering device 60, the complementary winding 64 is advantageously wound around the magnetic core having the smallest external diameter, in this instance the core 12. To optimize the arrangement of the windings 32 and 64, the winding 32 covers the complementary winding 64.

Figure 7:
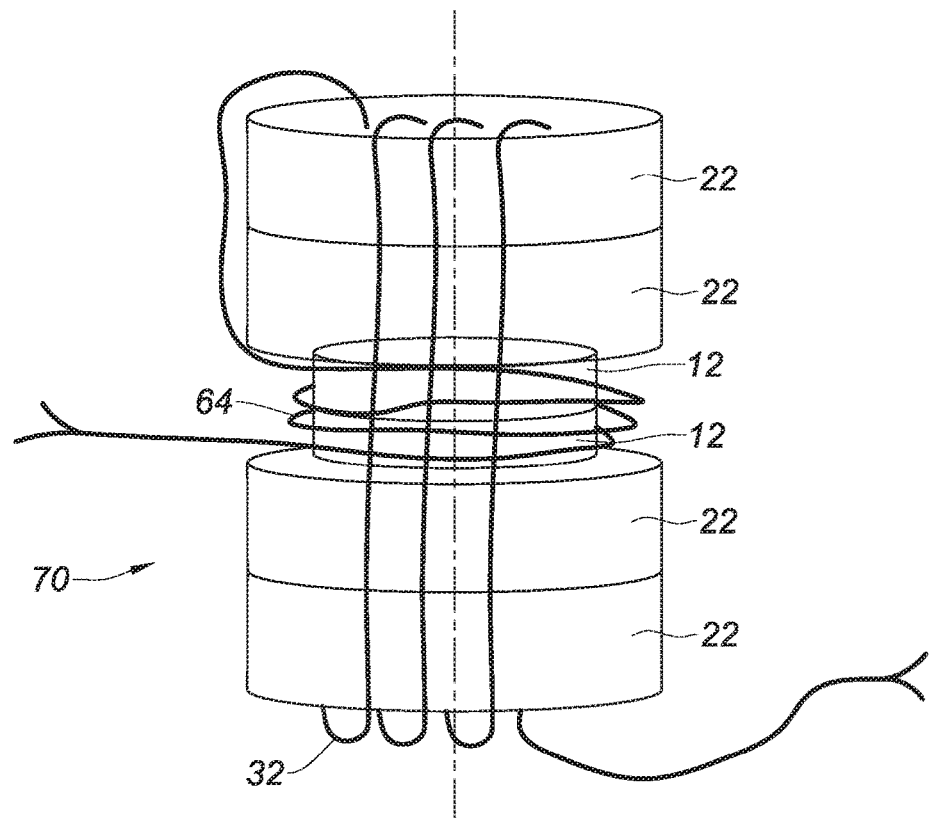

FIG. 7 shows another example 70 of the fifth variant inductive filtering device in which there are again magnetic cores 12 and 22. In this example, two magnetic cores 12 are arranged between two pairs of magnetic cores 22. As above, the complementary winding 64 is wound around the two magnetic cores 12.

Figure 8:
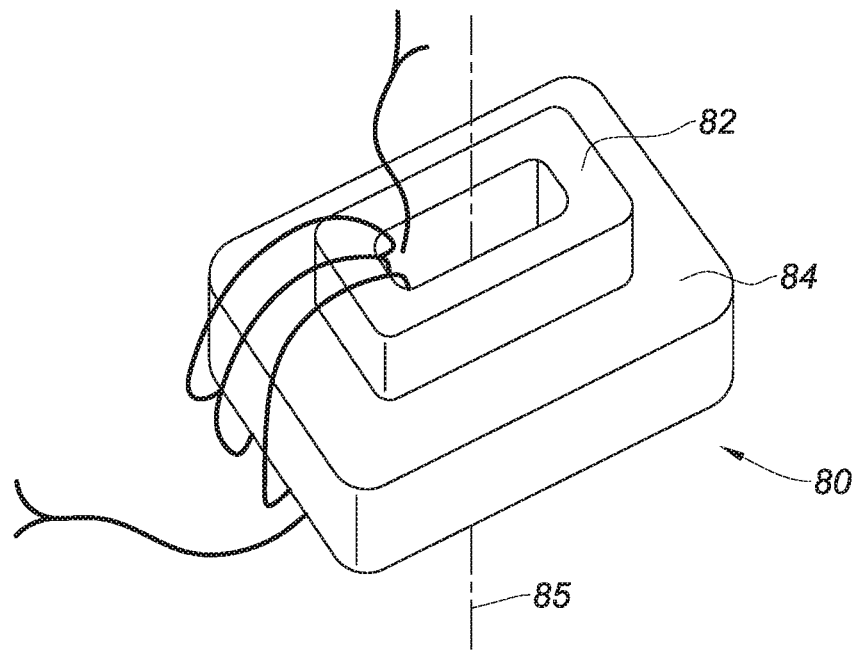
FIG. 8 shows a sixth variant inductive filtering device according to the invention implementing a plurality of toric magnetic cores superposed onto one another.

FIG. 8 shows a sixth variant inductive filtering device 80 implementing two toric magnetic cores 82 and 84 superposed onto one another. The arrangement of the magnetic cores 82 and 84 of the filtering device 80 is close to the arrangement of the magnetic cores 12 and 22 of the filtering device 20 of FIG. 2.

The two magnetic cores 82 and 84 have substantially rectangular external cross sections and central voids that also have substantially rectangular cross sections. As in FIG. 2, the magnetic cores 82 and 84 are tubular in shape and extend around the same axis 85. The rectangular cross sections are defined perpendicular to the axis 85. The cross sections of the central voids of the two magnetic cores 82 and 84 may be identical. However, the external cross section of the magnetic core 82 is smaller than that of the magnetic core 84. Thus, as above, the magnetic lengths of the two magnetic cores 82 and 84 are different.

In practice, it is possible to implement the invention regardless of the shape of the cross section of the central voids.

In the different variants described above, the magnetic cores have regular tubular shapes. Alternatively, in the context of the invention, it is possible to implement magnetic cores of irregular shape. This allows the magnetic properties of the cores to be adjusted according to the filtering requirement.

Figure 9:
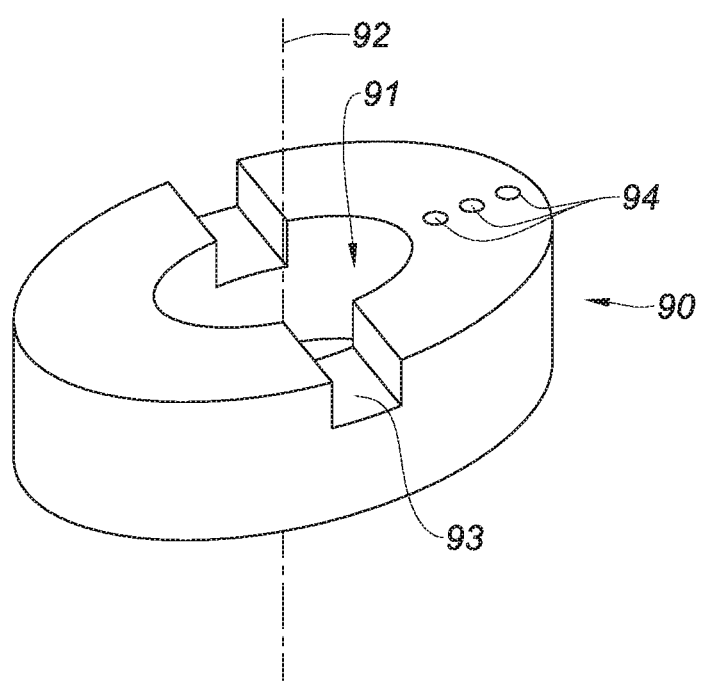
FIG. 9 shows a magnetic core that may be implemented in an inductive filtering device according to the invention.

FIG. 9 is a toric magnetic core 90. More specifically, the magnetic core 90 has a central void 91 that extends along an axis 92. The magnetic core 90 comprises a groove 93 that runs perpendicular to the axis 92. The magnetic core 90 also comprises blind or through-holes 94 extending parallel to the axis 92. The groove 93 and the holes 94 allow the overall magnetic behaviour of the magnetic core 90 to be modified with respect to a magnetic core which does not comprise these geometric irregularities. The irregularities form a partial air gap, resulting in an increase in the reluctance of the magnetic core. In practice, the magnetic behaviour of the magnetic core 90 may be likened to the behaviour of a magnetic core without geometric irregularity and featuring a material of lower magnetic permeability. For the same number of turns of the winding passing through the central void 91, the presence of geometric irregularities makes it possible to increase the current flowing through the winding for which saturation of the magnetic core is obtained. In FIG. 9, two types of geometric irregularities are shown by way of example. It is of course possible to implement only one type of irregularity or other types of irregularities. In particular, it is possible to employ an additive manufacturing process to produce the magnetic cores of a filtering device according to the invention. Such a manufacturing process allows any shape of region from which the magnetic material is absent to be produced, in particular completely hidden regions, i.e. regions without access to the outer surface of the magnetic core. A magnetic core exhibiting one or more geometric irregularities may be implemented in any of the filters shown in FIGS. 2 to 8. More generally, a magnetic core has a regular tubular shape when its cross section around the axis along which the central void extends is constant. Thus, the magnetic flux flowing through the magnetic core and around the axis of the central void does not experience any disruption due to the geometry of the magnetic core. Conversely, the tubular shape of the magnetic core is irregular when its cross section exhibits irregularities such as are for example described in FIG. 9. These irregularities form partial air gaps which disrupt the magnetic flux flowing through the magnetic core and around the axis of the central void.

Figure 10:
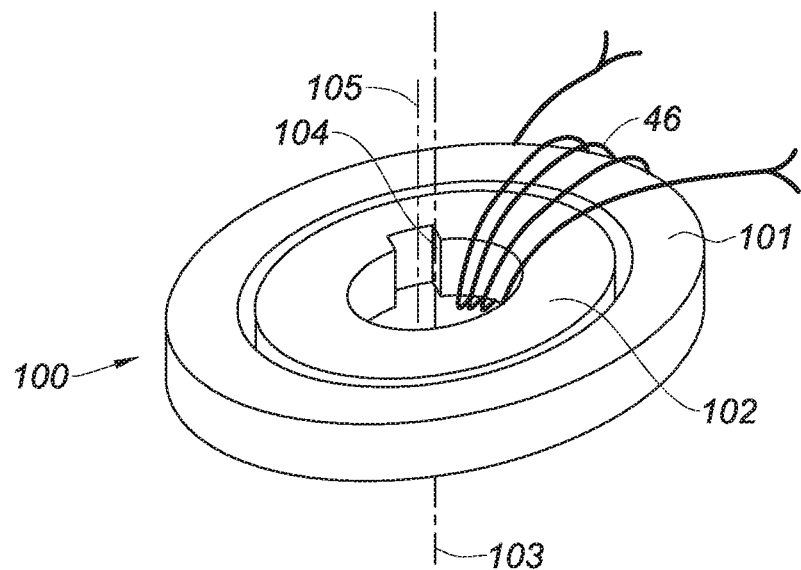
FIG. 10 shows a seventh variant inductive filtering device according to the invention implementing a plurality of series of toric magnetic cores inserted into one another.

FIG. 10 shows one variant inductive filtering device 100 having two distinct magnetic cores 101 and 102 inserted into one another like in the variant of FIG. 3. The magnetic core 102 is arranged in the central void of the magnetic core 101. The axes of the central voids of the magnetic cores 101 and 102 are coincident and bear the reference 103. There is again the winding 46 around the two magnetic cores 101 and 102 and passing through the central void of the magnetic core 102. The magnetic core 101 exhibits no irregularity. However, the magnetic core 102 features a groove 104 that runs along an axis 105 parallel to the axis 103. The groove 104 forms a partial air gap in the magnetic core 102 which tends to increase the reluctance of the magnetic core in comparison with a grooveless magnetic core. The groove 104 runs up the entire height of the central void 106, which height is defined along the axis 103 of the magnetic core 102.

The orientation of the groove 104 allows the magnetic core 102 to be better optimized than the orientation of the groove 93 for the magnetic core 90, in particular in terms of weight for the same magnetic properties. More specifically, the grooves 93 and 104 allow the reluctance of their respective magnetic core to be increased and the equivalent magnetic permeability value along the magnetic length L1 to be decreased. The shape of the groove 104, located entirely over a magnetic length that is shorter than the groove 93, makes its contribution to increasing the reluctance of the magnetic core more effective. It is of course possible to envisage a plurality of grooves 93 or 104 in the same magnetic core.

Figure 11:
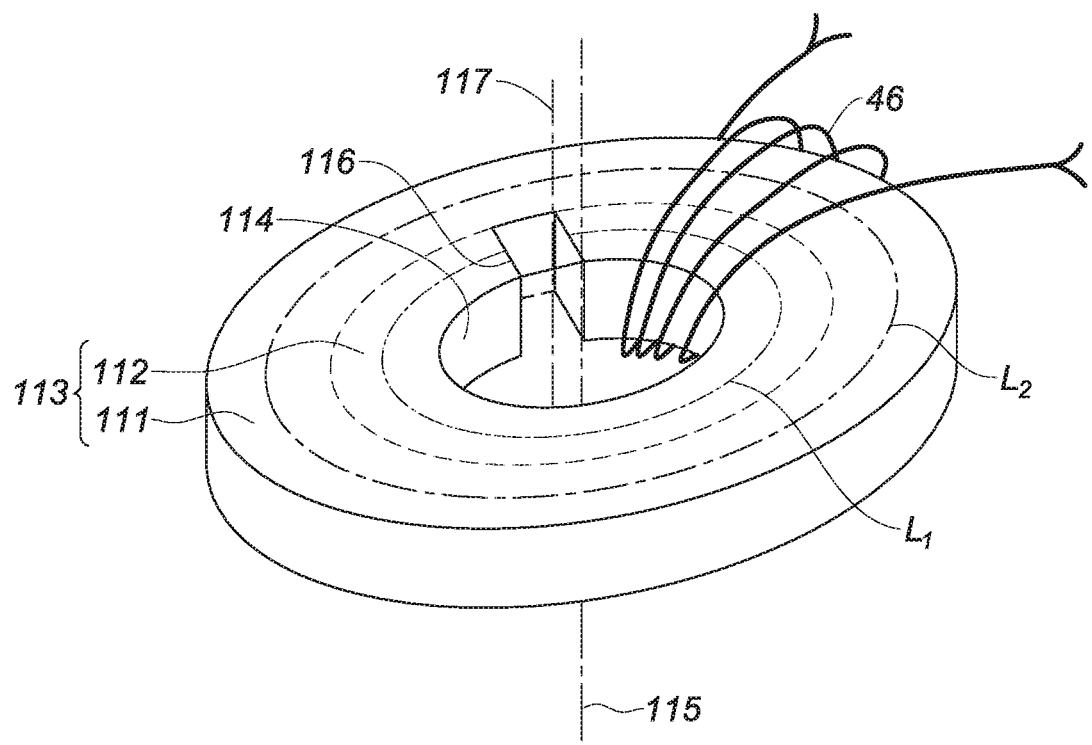
FIG. 11 shows an eighth variant filtering device according to the invention implementing a one-piece magnetic core.

FIG. 11 shows another variant inductive filtering device 110 having two toric magnetic cores 111 and 112 joined together to form a one-piece assembly 113 featuring a central void 114 that extends along an axis 115. The two toric magnetic cores 111 and 112 are concentric around the axis 115. There is again the winding 46 passing through the central void 114. In practice, the one-piece assembly 113 may be made as a single mechanical part and in the same material. The core 111 is similar to the core 101 and exhibits no irregularity. The core 112 features a groove 116 that runs along an axis 117 parallel to the axis 115. It is possible to produce the two toric magnetic cores 111 and 112 in two different materials set one into the other. Alternatively, it is possible to produce them in the same material, again set one into the other, or from a single magnetic core in which the groove 116 is made. There are again the two magnetic lengths $L_1$ for the magnetic core 112 and $L_2$ for the magnetic core 111. The field lines propagating along the length $L_2$ flow only inside a magnetic material, that of the core 112, while the field lines propagating along the length $L_1$ flow partly within the magnetic material of the core 111 and within the groove 116 which forms an air gap.

Figure 12A:
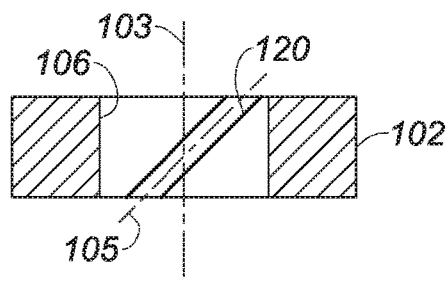
FIGS. 12a to 12g show a plurality of variant magnetic cores each comprising a groove of different shape.
Figure 12C:
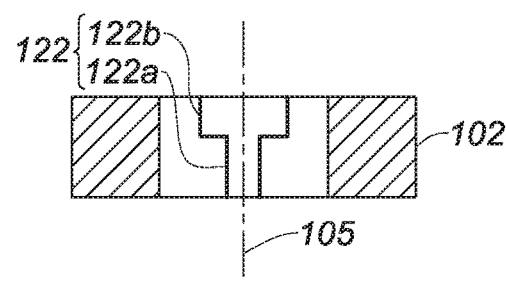
Figure 12B:
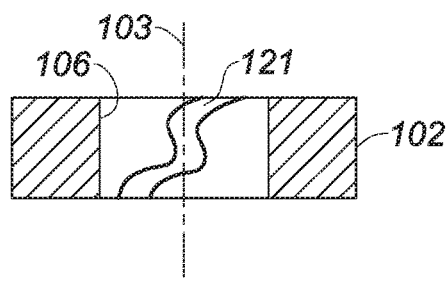
Figure 12D:
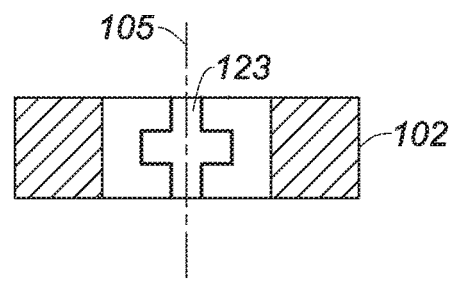
Figure 12E:
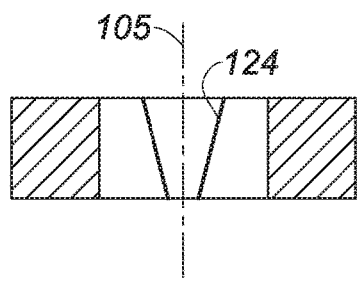
Figure 12F:
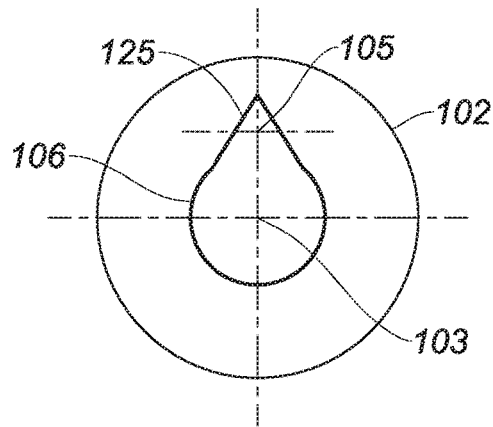
Figure 12G:
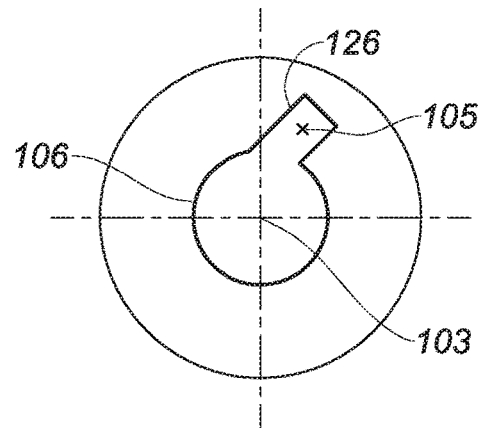

FIGS. 12a to 12g show several variant magnetic cores 102 or 113 comprising a groove which intersects all of the field lines that form along the shortest magnetic lengths of the core. In other words, the groove extends over the entire height of the central void 106, which height is defined along the axis 103. FIGS. 12a to 12e show the magnetic core 102 in cross section through a plane containing the axis 103 and FIGS. 12f and 12g show the magnetic core 102 from above in a plane perpendicular to the axis 103. In FIG. 12a, the groove 120 runs obliquely relative to the direction 103. The axis 105 of the groove 120 is inclined relative to the axis 103 of the central void 106. The axis 105 remains tangential to a cylinder of axis 103. With respect to the groove 104, the groove 120 allows the reluctance of the magnetic core 102 to be increased further by increasing the area of the faces facing the groove 120 with respect to that of the groove 104. This increase in reluctance may be obtained by means of a groove 121 following a non-rectilinear curve along the surface of the central void 106 of the magnetic core 102, as shown in FIG. 12b. Any curve allowing the length of the groove 121 to be increased with respect to the length of the groove 104 along its axis 105 may be implemented.

In FIG. 12c, the magnetic core 102 comprises a groove 122 in the shape of the letter T. The vertical stem of the T extends along the axis 105, which remains parallel to the axis 103, and the horizontal bar of the T extends perpendicular to the axis 105. The groove 122 comprises first portion 122a of narrow width perpendicular to the axis 105. The portion 122a forms the vertical stem of the T. The groove 122 comprises a second, wider portion 122b corresponding to the horizontal bar of the T. The two portions 122a and 122b exhibit different reluctances. The reluctance of the portion 122b is higher than that of the portion 122a. In operation, when the common-mode current increases in the winding 46 around the core 102, the magnetic core 102, in the lower portion thereof in which the groove 122 is narrowest, may saturate while remaining in its unsaturated domain in the upper portion thereof in which the field lines intersect the portion 122b of the groove. In other words, the groove 122 makes it possible to produce a core with tiered reluctance, lower with respect to the portion 122a and higher with respect to the portion 122b. Other embodiments of grooves may perform this function, for example the cross-shaped groove 123, as shown in FIG. 12d. The grooves 122 and 123 allow two-tiered reluctances to be obtained. It is possible to obtain a greater number of tiers by means of a stepped groove. It is also possible to vary the reluctance linearly along the axis 103, for example with a groove 124 in the shape of the letter V as shown in FIG. 12e. In other words, the cross section of the groove 124 widens along an abscissa of the axis 105. It is possible to combine the T-, cross- or V-shapes with an inclination of the groove such as shown in FIG. 12a or with a curve such as shown in FIG. 12b.

In FIG. 12f, the magnetic core 102 features a groove 125 that extends along an axis 105 parallel to the axis 103. The cross section of the groove 125 perpendicular to the axis 105 exhibits a V-shape that opens onto the central void 106. Thus, the reluctance of the magnetic core is higher in the vicinity of the central void 106 and decreases with distance from the central void 106. Shapes other than the V-shaped cross section are of course possible, for example curved shapes or tiered shapes when discontinuous variations in reluctance with distance from the central void 106 are desired.

In FIG. 12f, the magnetic core 102 features a groove 126 that extends along an axis 105 parallel to the axis 103. The cross section of the groove 126 perpendicular to the axis 105 exhibits a U-shape. The arms of the U extend in non-radial directions relative to the axis 103. Like for the core shown in FIG. 12a, the shape of the groove 126 allows the reluctance to be increased with respect to a groove of the same shape but oriented radially as shown in FIG. 10.

Like for the grooves 93 and 104, it is possible to envisage a plurality of grooves 120 to 126 in the same magnetic core 102.

Figure 13:
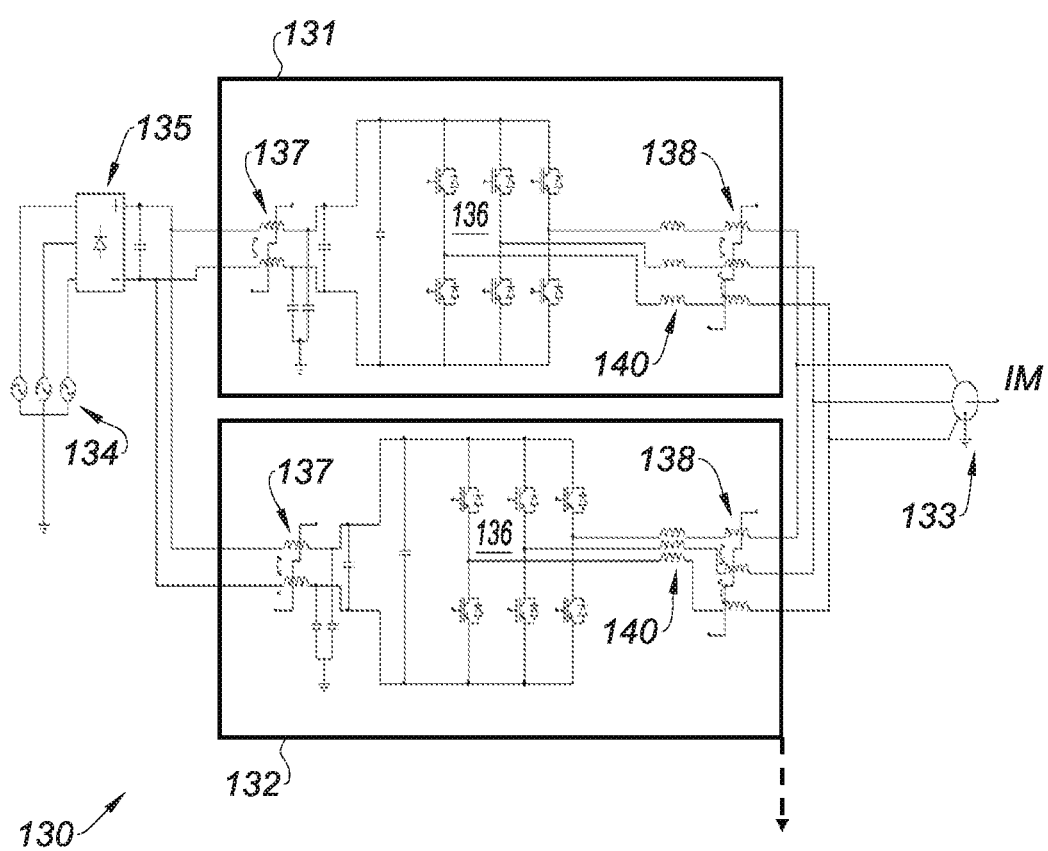
FIG. 13 shows an electrical architecture implementing a plurality of filtering devices according to the invention.

FIG. 13 shows an electrical architecture 130 implementing an inductive filtering device according to the invention. The electrical architecture 130 is highly suitable for installation in a vehicle, in particular an aircraft. The electrical architecture 130 comprises two converters 131 and 132 supplying a load 133 with power from an electrical energy source 134. The electrical architecture 130 is reconfigurable in real time. It allows a load to be supplied with power by as many converters as needed. The patent application published under the number EP 2 887 519 and filed by the applicant allows an understanding as to how to avoid recirculation currents in an architecture in which a plurality of converters are able to operate in parallel. To allow the electrical architecture to be reconfigured easily, patent application EP 2 887 519 describes the use of filtering devices incorporated into each of the converters.

Implementing inductive filtering devices according to the invention in a modular electrical architecture like the electrical architecture 130 makes it possible, by means of the same filtering devices, both to limit recirculation currents between the different converters connected in parallel and to ensure the electromagnetic compatibility of the electrical architecture 130. More specifically, filtering devices according to the invention make it possible to limit potential radiation emitted by the electrical architecture 130 and liable to interfere with other equipment on board the vehicle.

Each of the converters 131 and 132 receives energy from the electrical energy source 134 through a rectifier 135. The two converters 131 and 132 comprise, in the example shown, inverters 136 which each deliver a three-phase AC voltage. The outputs of the two converters 131 and 132 are connected to supply the load 133 with power. Other types of converters, in particular DC-to-DC converters, may be implemented in the context of the invention. The converters may be unidirectional or bidirectional.

At input, each of the converters 131 and 132 comprises a filtering device 137 connected between the output of the rectifier 135 and the inverter 136. Similarly, at output, each of the converters 131 and 132 comprises a filtering device 138 connected between the inverter 136 and the load 133. The filtering devices 137 and 138 each comprise at least two toric magnetic cores such as described above. The filtering devices 137, filtering the DC voltage delivered by the rectifier 135, each comprise two electrical conductors wound together by passing through the central voids of the respective magnetic cores thereof, one conductor for the positive voltage and another for the negative voltage. The direction of winding of the two conductors is defined such that differential currents in each of the conductors generate opposing fluxes in the two cores. Similarly, the filtering devices 138, filtering the three-phase output voltage delivered by each of the inverters 136, each comprise three electrical conductors wound together by passing through the central voids of the respective magnetic cores thereof, one conductor for each of the phases. At output, like at input, the direction of winding of the three conductors is defined such that the fluxes generated by each of the three conductors cancel each other out overall. The invention may be implemented regardless of the number of phases at the input or output of the converters. The number of conductors wound together around the magnetic cores of a filtering device is equal to the number of phases that need to be filtered.

Because of their magnetic cores common to a plurality of wound conductors, one per phase, the filtering devices 137 and 138 allow common-mode interference to be filtered. In addition, it is possible to add to each of the phases, here to the output phases, differential-mode filtering devices 140 such as inductors connected in series to each of the phases.

Regarding the common-mode filtering devices 137 and 138, because of the presence of a plurality of magnetic cores, each of them may saturate for a different current flowing through the two or three wound electrical conductors. The saturation obtained for the smallest current is reached for the core having the shortest magnetic length and/or the highest magnetic permeability. This core is suitable for filtering, generally high-frequency, electromagnetic interference. At the saturation point of the first of the magnetic cores, the one or more other magnetic cores of the filtering device have not yet saturated. These one or more other cores are sized to limit recirculation currents between the different converters 131 and 132. These recirculation currents may be very large, equivalent to a short circuit at the output of the rectifier 135. In this case, by virtue of the combined winding of the conductors at the filters 137 and/or 138, and by virtue of the presence of a magnetic core of low relative magnetic permeability (lower than 3000) which is sized so as not to saturate for this short-circuit current, the filter in question will be able to limit a recirculation current between the two converters 131 and 132 for long enough to trigger another protection means, for example a circuit breaker. When filtering strong currents such as recirculation currents, the other magnetic cores will have saturated and will no longer perform their filtering function. In other words, the filter according to the invention provides conventional common-mode filtering in the absence of recirculation currents and a degraded-mode safety function, if recirculation currents happen to arise.

The filtering device may thus provide electromagnetic filtering and limit recirculation currents as long as the currents flowing through the filtering devices remain smaller than the saturation currents of all of the magnetic cores. In the event of malfunction, if the currents flowing through the filtering devices increase above the smallest saturation current, although the filtering device might lose its electromagnetic filtering function, it may still perform its function of limiting recirculation currents, which makes it possible to prevent overcurrents that could destroy the components of the converter.

In FIG. 13, the two converters 131 and 132 receive energy from a rectifier 135 common to the two converters. It is also possible to implement the invention for AC-to-AC converters. In other words, each converter comprises its own rectifier. In this case, for each of the converters, the filtering devices 137 are arranged between the rectifier and the corresponding inverter 136. Additionally, it is possible to provide, in each of the converters, at the input thereof, between the common power supply via an AC network and the rectifier of each converter, a filtering device similar to the filtering device 138. Like for the converters 131 and 132, the implementation of AC-to-AC converters is highly modular. Incorporating filtering devices according to the invention into each of the converters makes it possible to arrange as many converters in parallel as necessary to supply the same load with power while avoiding the use of filtering common to a plurality of converters.

The invention claimed is:

1. An inductive filtering device comprising a plurality of grouped electrical conductors, each intended to carry a different voltage, and at least two toric magnetic cores, each formed around a central void, the at least two toric magnetic cores having different magnetic lengths, the plurality of grouped electrical conductors being wound together around the at least two toric magnetic cores by passing through the central voids of the at least two toric magnetic cores, wherein the at least two toric magnetic cores are formed in different materials, the material of the magnetic core having the shortest magnetic length exhibiting a maximum relative magnetic permeability lower than or equal to 3000 and lower than that of the material of the magnetic core having the longest magnetic length; wherein the plurality of grouped electrical conductors together form at least one turn wound around the at least two toric magnetic cores and at least one other turn wound around the magnetic core having the shortest magnetic length without being wound around the other of the at least two toric magnetic cores.

2. An electrical architecture comprising a plurality of converters suitable for supplying a load with power in parallel, each of the converters comprising at least one inductive filtering device according to claim 1, wherein the converters receive energy in the form of direct current and deliver energy in the form of polyphase alternating currents,
wherein each converter comprises, at an input, the respective inductive filtering device wherein the direct current flows through the plurality of grouped electrical conductors wound together,
wherein each converter comprises, at an output, the respective inductive filtering device wherein the alternating currents flow through the at least two toric magnetic cores conductors wound together.

3. The inductive filtering device according to claim 1, wherein each of the central voids extends along an axis, the axes being coincident.

4. The inductive filtering device according to claim 1, wherein each of the central voids has an empty cross section perpendicular to the respective axis thereof and wherein the empty cross sections are identical.

5. The inductive filtering device according to claim 4, wherein the at least two toric magnetic cores form a one-piece assembly.

6. The inductive filtering device according to claim 1, wherein one of the at least two toric magnetic cores is arranged inside the central void of the other magnetic core.

7. The inductive filtering device according to claim 1, wherein the at least two toric magnetic cores exhibit regular tubular shapes.

8. The inductive filtering device according to claim 1, wherein the at least two toric magnetic cores exhibit irregular tubular shapes.

9. The inductive filtering device according to claim 8, wherein the magnetic core having the shortest magnetic length comprises at least one groove configured to increase a reluctance of the magnetic having the shortest magnetic length core over the entire height of the central void, where height is defined along an axis around where the central void is formed.

10. The inductive filtering device according to claim 9, wherein the groove is configured to vary the reluctance of the magnetic having the shortest magnetic length core along an abscissa of the axis around which the central void is formed.

11. The inductive filtering device according to claim 9, wherein the groove is configured to lower the reluctance of the magnetic having the shortest magnetic length core with a distance away from the axis around which the central void is formed.

12. An electrical architecture comprising a plurality of converters suitable for supplying a load with power in parallel, each of the plurality of converters comprising at least one inductive filtering device comprising a plurality of grouped electrical conductors, each intended to carry a different voltage, and at least two toric magnetic cores, each formed around a central void, the at least two toric magnetic cores having different magnetic lengths, the plurality of grouped electrical conductors being wound together around the at least two toric magnetic cores by passing through the central voids of the at least two toric magnetic cores, wherein the toric magnetic cores are formed in different materials, the material of the magnetic core having the shortest magnetic length exhibiting a maximum relative magnetic permeability lower than or equal to 3000 and lower than that of the material of the magnetic core having the longest magnetic length.

13. An inductive filtering device comprising a plurality of grouped electrical conductors, each intended to carry a different voltage, and at least two toric magnetic cores, each formed around a central void, the two magnetic cores having different magnetic lengths, the electrical conductors being wound together around the at least two toric magnetic cores by passing through the central voids of the at least two toric magnetic cores, wherein the at least two toric magnetic cores are formed in different materials, the material of the magnetic core having the shortest magnetic length exhibiting a maximum relative magnetic permeability lower than or equal to 3000 and lower than that of the material of the magnetic core having the longest magnetic length, wherein the plurality of grouped electrical conductors form a complementary winding wound around the at least two toric magnetic cores without passing through the central void thereof.

14. The inductive filtering device according to claim 13, wherein one of the at least two toric magnetic cores is arranged inside the central void of the other magnetic core.

15. The inductive filtering device according to claim 13, wherein the at least two toric magnetic cores exhibit irregular tubular shapes.

16. The inductive filtering device according to claim 15, wherein the magnetic core having the shortest magnetic length comprises at least one groove configured to increase a reluctance of the magnetic core over the entire height of the central void, where height is defined along an axis around where the central void is formed.

17. An inductive filtering device comprising a plurality of grouped electrical conductors, each intended to carry a different voltage, and at least two toric magnetic cores, each formed around a central void, the at least two toric magnetic cores having different magnetic lengths, the plurality of grouped electrical conductors being wound together around the at least two toric magnetic cores by passing through the central voids of the at least two toric magnetic cores, wherein the at least two toric magnetic cores are formed in different materials, the material of the magnetic core having the shortest magnetic length exhibiting a maximum relative magnetic permeability lower than or equal to 3000 and lower than that of the material of the magnetic core having the longest magnetic length; and the inductive filtering device further comprising a plurality of series of toric magnetic cores inserted into one another, the magnetic cores of a first of the series being nested around a first axis, the magnetic cores of a second of the series being nested around a second axis, the first axis being distinct from the second axis, wherein the electrical conductor forms a first winding around the first of the series and forms a second winding around the second of the series.

18. The inductive filtering device according to claim 17, wherein the at least two toric magnetic cores exhibit irregular tubular shapes.

19. The inductive filtering device according to claim 18, wherein the magnetic core having the shortest magnetic length comprises at least one groove configured to increase a reluctance of the magnetic core over the entire height of the central void, where height is defined along an axis around where the central void is formed.

20. The inductive filtering device according to claim 17, wherein one of the at least two toric magnetic cores is arranged inside the central void of the other magnetic core.

* * * * *